(12) United States Patent
Tian et al.

(10) Patent No.: US 10,566,197 B2
(45) Date of Patent: Feb. 18, 2020

(54) FILM CARRIER, FILM APPLICATION APPARATUS, FILM APPLICATION METHOD, AND FILM TO BE APPLIED USED IN DISPLAY PANEL

(71) Applicant: BOE Technology Group Co., Ltd., Beijing (CN)

(72) Inventors: Biao Tian, Beijing (CN); Shihlun Chen, Beijing (CN); Litao Qu, Beijing (CN); Tao Jin, Beijing (CN); Jianhui Zhang, Beijing (CN); Jieshu Wu, Beijing (CN); Yong Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/136,795

(22) Filed: Sep. 20, 2018

(65) Prior Publication Data
US 2019/0237334 A1      Aug. 1, 2019

(30) Foreign Application Priority Data
Feb. 1, 2018   (CN) .......................... 2018 1 0103590

(51) Int. Cl.
*H01L 21/203*  (2006.01)
*H01L 21/56*   (2006.01)
*H01L 23/34*   (2006.01)
*H01L 51/52*   (2006.01)
*H01L 51/56*   (2006.01)

(52) U.S. Cl.
CPC ............ *H01L 21/203* (2013.01); *H01L 21/56* (2013.01); *H01L 23/345* (2013.01); *H01L 51/5237* (2013.01); *H01L 51/56* (2013.01)

(58) Field of Classification Search
CPC ...................................................... H01L 21/203
See application file for complete search history.

(56) References Cited

U.S. PATENT DOCUMENTS

| | | | | |
|---|---|---|---|---|
| 2011/0120619 | A1* | 5/2011 | Harada | B29C 66/1122 156/64 |
| 2014/0377508 | A1* | 12/2014 | Oh | B32B 37/10 428/174 |

* cited by examiner

*Primary Examiner* — William A Harriston
(74) *Attorney, Agent, or Firm* — Nath, Goldberg & Meyer; Joshua B. Goldberg; Daniel J. Bissing

(57) ABSTRACT

The present disclosure discloses a film carrier, a film application apparatus, a film application, and a film to be applied used in a display panel. The film carrier comprises: a main body part and an attraction member. The main body part has a supporting surface and is configured to be rotatable to drive the supporting surface to swing about an axial direction of the main body part. The supporting surface has a curved projection in a plane perpendicular to the axial direction. The attraction member is disposed on the main body part for attracting the film to be applied on the supporting surface.

15 Claims, 4 Drawing Sheets

FILM CARRIER, FILM APPLICATION APPARATUS, FILM APPLICATION METHOD, AND FILM TO BE APPLIED USED IN DISPLAY PANEL

CROSS-REFERENCE TO RELATED APPLICATION

This application claims the priority of China Patent Application No. 201810103590.9, filed in China on Feb. 1, 2018, the entire contents of which are hereby incorporated by reference.

TECHNICAL FIELD

The present disclosure relates to the technical field of packaging of display panels, and in particular relates to a film carrier, a film application apparatus, a film application method, and a film to be applied used in a display panel.

BACKGROUND

In the related art, an OLED device is required to be packaged after being fabricated, so as to protect the device from water and oxygen. The film application apparatus (e.g. laminator) in the packaging process is an apparatus for bonding a film to protect the OLED device. A metal film packaging process is introduced in a large-scale packaging process in the field of OLED display product fabrication, where a metal film is bonded to a display panel through an adhesive film covered thereon. Before applying the metal film to the display panel, a release film covering the adhesive film is required to be peeled off, and then the metal film is bonded on the display panel through the adhesive film.

SUMMARY

The present disclosure provides a film carrier, comprising: a main body part with a supporting surface, the main body part being configured to be rotatable to drive the supporting surface to swing around an axial direction of the main body part, and the supporting surface having a curved projection in a plane perpendicular to the axial direction; and an attraction member, which is disposed on the main body part and configured to attract a film to be applied on the supporting surface.

Alternatively, the supporting surface has an arched projection in the plane perpendicular to the axial direction.

Alternatively, the attraction member is at least one of a vacuum attraction member and a magnetic attraction member.

Alternatively, the attraction member includes a vacuum attraction member and a magnetic attraction member, each of which is configured to be distributed layer by layer along a bending direction of the supporting surface, and each layer of the vacuum attraction member and each layer of the magnetic attraction member are capable of independently attracting the film to be applied.

Alternatively, the magnetic attraction member includes a plurality of electromagnets, the vacuum attraction member includes a plurality of suction holes distributed on the main body part in communication with the supporting surface, and the plurality of electromagnets and the plurality of suction holes are both distributed along the bending direction of the supporting surface in sequence.

Alternatively, the plurality of electromagnets are disposed to be spaced from each other at a back of the supporting surface.

Alternatively, one end of the plurality of suction holes passes through the supporting surface, while the other end of the plurality of suction holes is configured to be connected to a vacuumizing device.

Alternatively, a heating member is disposed on the main body part for heating the supporting surface.

Alternatively, the attraction member includes at least a magnetic attraction member, and the heating member is disposed to be further away from the supporting surface in a radial direction of the main body part than the magnetic attraction member.

Alternatively, the film carrier further includes: a control unit and a temperature control element, wherein the heating member and the temperature control element are both electrically connected to the control unit, the temperature control element is adapted to detect a temperature of the supporting surface and send a temperature signal to the control unit, and the control unit is adapted to turn off the heating member when a temperature value detected by the temperature control element is higher than a first temperature value, and turn on the heating member when the temperature value detected by the temperature control element is lower than the first temperature value.

Alternatively, a curvature of the projection of the supporting surface in the plane perpendicular to the axial direction is constant, and an axis of the projection at a curvature centre of the projection is parallel to or coincident with an axis of rotation of the main body part.

Alternatively, the supporting surface is an elastic friction surface.

Alternatively, the main body part is configured to be rotatable and stay at a first flip angle, and be movable in a direction perpendicular to the axial direction.

Alternatively, the film carrier further includes an adjustment motor, a pressure sensing element, and a control unit electrically connected to the adjustment motor and the pressure sensing element, respectively, the pressure sensing element being configured to detect a pressure on the supporting surface and send a pressure signal to the control unit, the control unit being configured to, when the supporting surface is under an inconsistent pressure in the axial direction, control the adjustment motor to adjust a levelness of the main body part until the supporting surface is under a consistent pressure in the axial direction.

The present disclosure further provides a film application apparatus, comprising: a peeling device having two peeling members that are arranged in parallel and movable in opposite directions; and the abovementioned film carrier adapted to carry a film to be applied, wherein the film to be applied includes a metal film, an adhesive film and a release film stacked in sequence, the release film has a dividing line predividing the release film into two parts, and the two peeling members are configured to be capable of peeling off the two parts of the release film at two sides of the dividing line, respectively.

The present disclosure further provides a film to be applied used in the abovementioned film carrier, wherein the film to be applied includes a metal film, an adhesive film and a release film stacked in sequence, the release film having a dividing line predividing the release film into two parts.

The present disclosure further provides a film application method, comprising: placing a film to be applied on the curved supporting surface of the film carrier as described above; controlling an attraction member to attract the film to be applied; sticking labels to adjacent corners of two parts of a release film of the film to be applied at two sides of a dividing line; pulling each of the labels in a direction away from the dividing line to pull the release film, so as to peel off the two parts of the release film, respectively; controlling a heating member of the film carrier to heat the supporting surface for a first time value; moving the film carrier to just below a substrate of a display panel and making the substrate correspond to a metal film of the film to be applied; adjusting a levelness and a flip angle of a main body part; bonding an end of the adhesive film of the film to be applied close to the substrate to the substrate, roll-pressing the metal film and then controlling the attraction member to stop attraction synchronically with the metal film separating from the supporting surface.

BRIEF DESCRIPTION OF THE DRAWINGS

The above and/or additional aspects and advantages of the present disclosure will become apparent and readily understood from the description of embodiments with reference to the drawings below, in which.

DETAILED DESCRIPTION OF THE EMBODIMENTS

Figure 1:
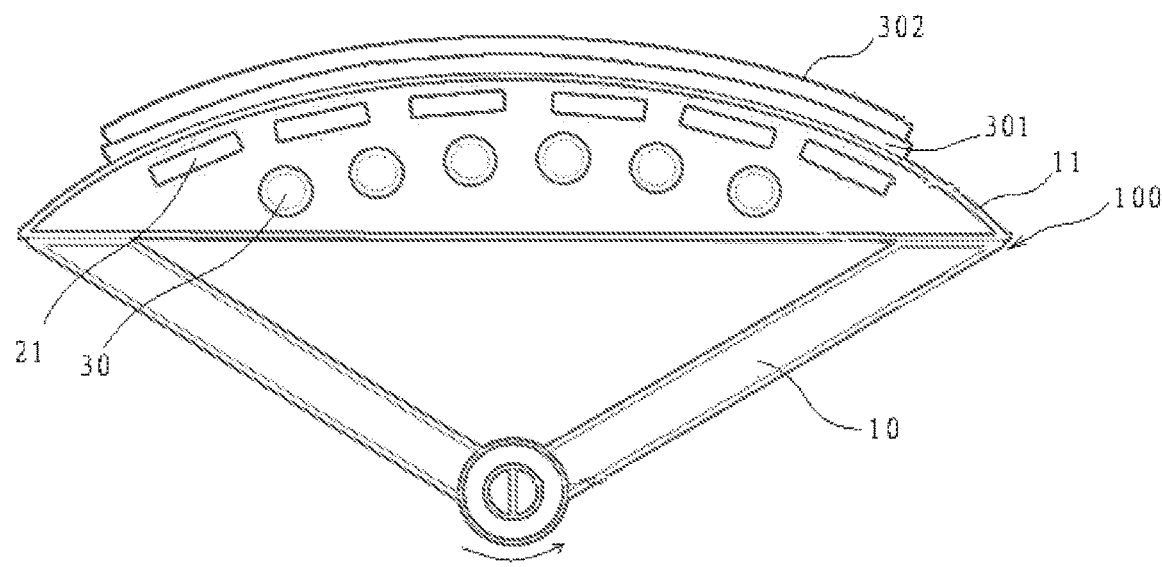
FIG. 1 is a schematic view showing a film to be applied on a film carrier after peeling off the release film according to an embodiment of the disclosure.
Figure 2:
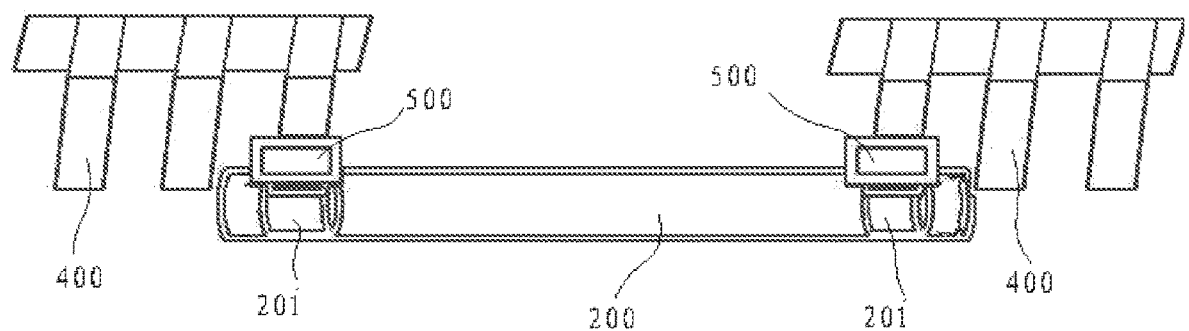
FIG. 2 is a schematic view showing peeling members of a peeling device firstly aligned to grab a label according to an embodiment of the disclosure.

The embodiments of the disclosure will now be described in detail with the examples thereof shown in the drawings throughout which, the same or similar reference signs refer to the same or similar units or units with the same or similar functions. The embodiments described below with reference to the drawings are merely exemplary, and are used only for the purpose of explaining the disclosure and should not be interpreted as limitations to the disclosure.

The film carrier 100 according to an embodiment of the disclosure will be described in detail below with reference to FIGS. 1 to 8.

It should be noted that the film carrier 100 of the embodiment of the disclosure is used for carrying a film to be applied 300 to enable temporary positioning of the film to be applied 300. The following is mainly described by taking the application of the film carrier 100 in the display panel packaging as an example. However, the film carrier 100 of the embodiment of the disclosure is not limited to applications in the field of display panel packaging, and is also applicable to packaging and film application of similar electronic components.

As shown in FIG. 1, the film carrier 100 according to an embodiment of a first aspect of the disclosure includes: a main body part 10 and an attraction member. The main body part 10 has a supporting surface 11 and is configured to be rotatable to drive the supporting surface 11 to swing about an axial direction of the main body part 10. The supporting surface 11 has a curved projection in a plane perpendicular to the axial direction. The attraction member is disposed on the main body part 10 for attracting the film to be applied 300 on the supporting surface 11. Here, the axial direction of the main body part 10 means a direction perpendicular to a paper surface of FIG. 1.

It should be understood that the attraction member disposed on the main body part 10 means that the attraction member is integrated on the main body part 10. Specifically, the attraction member may be embedded in the main body part 10, or disposed at any suitable position on the main body part 10 that will not influence flatness of the supporting surface 11.

Figure 6:
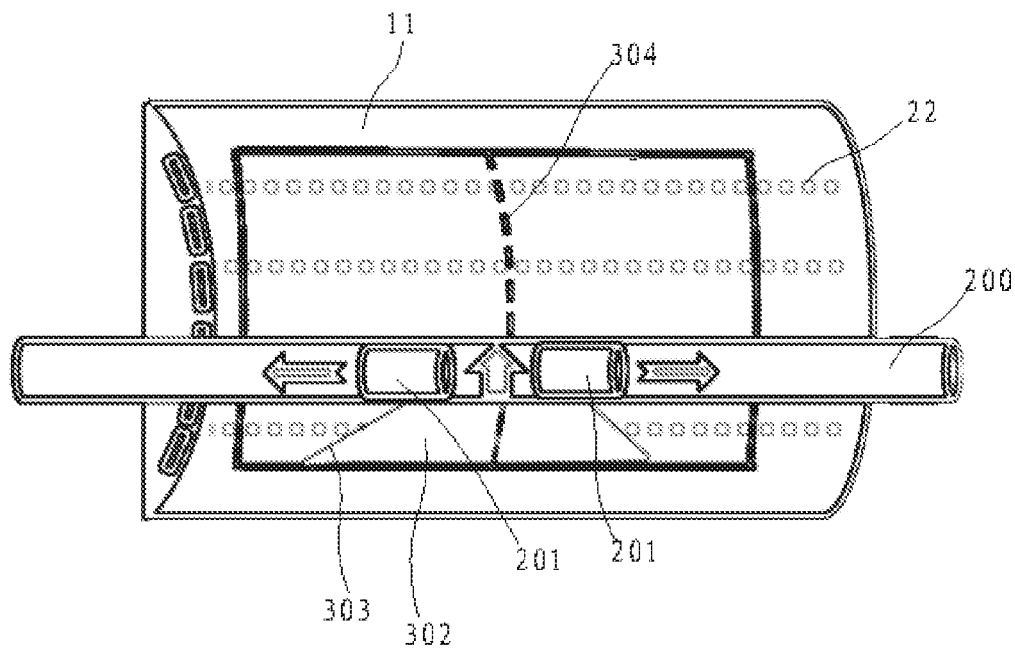
FIG. 6 is a schematic view showing the peeling device peeling off the release film according to an embodiment the disclosure.
Figure 8:
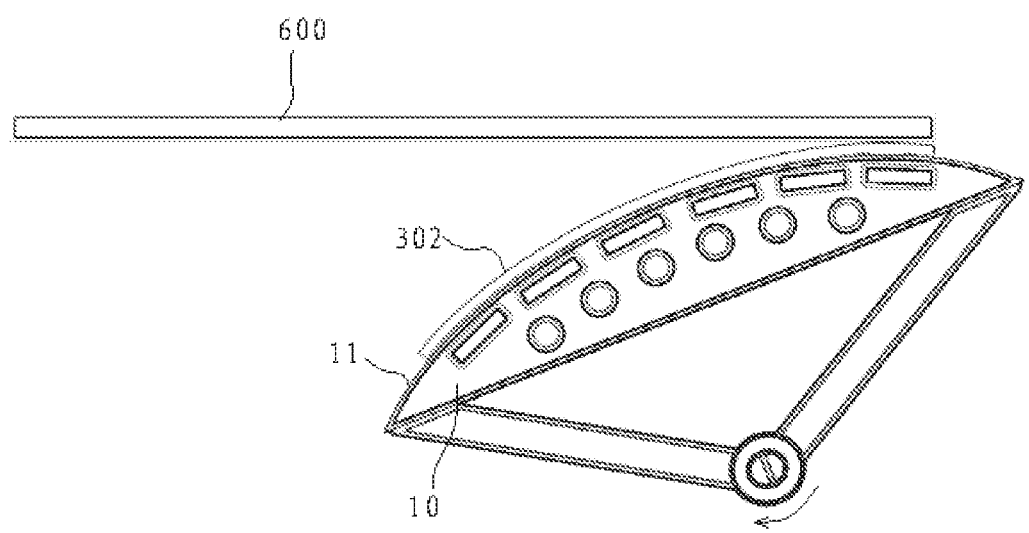
FIG. 8 is a schematic view showing a film application process according to an embodiment of the disclosure.

As shown in FIGS. 1, 6 and 8, the film to be applied 300 may include at least a metal film 301 (or a non-metal film) and an adhesive film 302 attached to the metal film 301. In order to reduce damage to the adhesive film 302 before the film is applied, a surface of the adhesive film 302 is usually covered with a layer of a release film 303. In this manner, the release film 303 may form a good protection for the adhesive film 302. In the film application and packaging process of display panels, after the film to be applied 300 is placed on the supporting surface 11 of the main body part 10, the release film 303 is first peeled off, and then the adhesive film 302 and the metal film 301 as a whole are attached to a substrate 600 of the display panel.

Apparently, the substrate 600 of the display panel may also be packaged using a film to be applied 300 without the release film 303. Then, there is no need to perform the film peeling process. In the present disclosure, a film to be applied 300 with a release film 303 being peeled off and a film to be applied 300 with a release film 303 being not peeled off are not distinguished in the name, collectively referred to as the film to be applied 300. It should be understood by those skilled in the art that the film to be applied 300 during the film application process may not have the release film 303.

Referring to FIG. 1, the main body part 10 is configured to be rotatable, so as to drive the supporting surface 11 to swing about the axial direction of the main body part 10, wherein a plane where the projection of the supporting surface 11 located is perpendicular to the axial direction of the main body part 10.

In other words, the main body part 10 may be connected to a rotary motor directly or via a transmission mechanism, so as to make the main body part 10 rotatable. Therefore, an inclination angle of the supporting surface 11 with respect to the substrate 600 of the display panel is adjustable, so that the supporting surface 11 may be adjusted to a proper inclination angle according to a size, shape and the like of the display panel to obtain a better film application efficiency.

It should be noted that the main body part 10 of the film carrier may be rotated around the axial direction or translated. The rotation (a rotation direction is shown by the arrow in FIG. 1) and movement (a movement direction is shown by the arrows in FIG. 7) of the main body part 10 may not be limited to the preparation work before film application. If a position of the main body part 10 needs to be adjusted during the film application, the inclination angle of the supporting surface 11 may be adjusted in real time by controlling a rotary motor; or the main body part 10 may be moved in real time by controlling a linear motor. The above manner still falls within the protection scope of the present disclosure, details of which are not repeated herein.

The film carrier 100 according to the embodiment of the first aspect of the disclosure attracts the film to be applied 300 onto the curved supporting surface 11 of the main body part 10 through the attraction member. Here, the curved supporting surface means that the supporting surface 11 has a curved projection in a plane perpendicular to the axial direction. Unless otherwise specified, the following bending direction also refers to a bending direction of the supporting surface 11 in the plane perpendicular to the axial direction. After the release film 303 of the film to be applied 300 is peeled off, the main body part 10 is controlled to rotate around the axial direction, so that the supporting surface 11 is brought closer to or away from the substrate 600 of the display panel to which the film is to be applied, and thus the main body part 10 is swung and stays at a proper angle. In this manner, the film to be applied 300 is separated from the carrier film stage 100 from a portion of the film to be applied 300 closer to the substrate 600 to a portion of the film to be applied 300 away from the substrate 600 sequentially, and portions of the film to be applied 300 separated from the film carrier 100 are sequentially rolled and attached to the substrate 600.

Due to the curved design of the supporting surface 11, the film to be applied 300 may be prepared to be bent away from the substrate 600. Thereby, an attraction force of the attraction member of the film carrier 100 is controlled, so that the bent metal film 301 attached to a surface of the supporting surface 11 under an action of the attraction force may be automatically attached to the display panel sequentially under an action of its own elastic restoring force. Thus, occurrence of bulging in the metal film 301 is reduced, alignment accuracy of the film and flatness of the film are enhanced, and film yield and film application efficiency are also improved.

Alternatively, the supporting surface 11 has an arched projection in the plane perpendicular to the axial direction. Here, the arched shape may be a part of a circle, a part of an ellipse, or a part of a parabola or the like. The supporting surface 11 with such configuration further reduces occurrence of bulging in the metal film 301, enhances alignment accuracy of the film and flatness of the film, and improves film yield and film application efficiency. In addition, steps of adjusting positions during the film application may be simplified and reduced, and the film application may be completed by a simple turning operation.

In the film carrier 100 according to an embodiment of the disclosure, the attraction member is at least one of a vacuum attraction member and a magnetic attraction member. The film to be applied 300 may be effectively attracted by vacuum attraction or magnetic attraction. In addition, in the case where the attraction member 300 is a vacuum attraction member and a magnetic attraction member, the metal film 301 may be attracted by magnetism of the magnetic attraction member while the film to be applied 300 is attracted by vacuum. Thereby, an auxiliary effect of the magnetic attraction may further enhance stability of the film to be applied 300 on the curved supporting surface 11 and ensure reliability of the film application.

Figure 5:
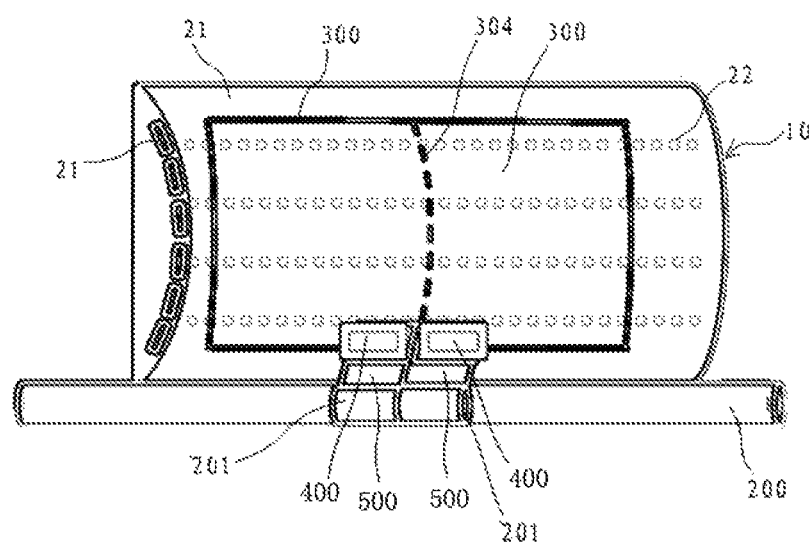
FIG. 5 is a schematic view showing a label attached on the release film according to an embodiment of the disclosure.

In some embodiments, the attraction member includes a vacuum attraction member and a magnetic attraction member, each of which is configured to be distributed layer by layer along a bending direction of the supporting surface 11. As shown in FIG. 5, each layer of the vacuum attraction member and each layer of the magnetic attraction member are capable of independently attracting the film to be applied. That is, the attraction member provided on the main body part 10 may include both a vacuum attraction member and a magnetic attraction member. The vacuum attraction members may be distributed in a plurality of rows along the bending direction of the supporting surface 11 (i.e., a contour direction of the arch in FIG. 1), and each row of the vacuum attraction members may be operated independently. Similarly, the magnetic attraction members may be distributed in a plurality of rows along the bending direction of the supporting surface 11 (i.e., a contour direction of the arch in FIG. 1), and each row of the magnetic attraction members may be operated independently.

In this manner, both vacuum attraction and magnetic attraction are employed. A vacuum attraction force and a magnetic attraction force may stably attract the film to be applied 300 having the metal film 301 on the supporting surface 11. During the film application, the vacuum attraction member and the magnetic attraction member are gradually controlled, so that the vacuum attraction member and the magnetic attraction member gradually stop attracting layer by layer (row by row). Thus, the metal film 301 which loses the attraction force may be separated from the supporting surface 11 and attached on the substrate 600 more stably.

Alternatively, the magnetic attraction member includes a plurality of electromagnets 21, and the vacuum attraction member includes a plurality of suction holes (or suction channel) 22 distributed on the main body part 10 in communication with the supporting surface 11. The plurality of electromagnets 21 and the plurality of suction holes are both distributed along the bending direction of the supporting surface 11 in sequence. Specifically, one end of the plurality of suction holes 22 may pass through the supporting surface 11, while the other end of the plurality of suction holes 22 is configured to be connected to a vacuumizing device. In this manner, the vacuum attraction member has a simple structure and is easily integrated on the main body part 10. Alternatively, the plurality of electromagnets 21 may be disposed spaced from each other at a back of the supporting surface 11. Since the plurality of electromagnets 21 are disposed spaced from each other at the back of the supporting surface 11, the plurality of electromagnets 21 are closer to the film to be applied. Thus, each of the electromagnets 21 may be effectively and accurately controlled, while accuracy of the film alignment and flatness of the film are enhanced.

As shown in FIG. 1, the film carrier 100 further includes a heating member 30 disposed on the main body part 10 for heating the supporting surface 11. In this manner, the heating member 30 may heat the film to be applied 300 before it is attached to the substrate 600, thereby sufficiently softening the adhesive film 302 of the film to be applied 300. Therefore, the yield of the film is improved while avoiding occurrence of the problem that the substrate 600 is bent due to thermal deformation if the substrate 600 is directly heated.

It should be understood that the heating member 30 may be a resistance wire or a heating electrode or the like. The heating member 30 may be evenly distributed on the main body part 10 to uniformly heat the supporting surface 11.

In some embodiments, the attraction member includes at least a magnetic attraction member. With respect to the magnetic attraction member, the heating member 30 is disposed in a radial direction of the main body part 10 further away from the supporting surface 11. That is, in the radial direction, the magnetic attraction member is located between the heating member 30 and the supporting surface 11. As shown in FIG. 1, the heating member 30, the electromagnet 21, and the supporting surface 11 are sequentially disposed in the radial direction with a rotation axis of the main body part 10 as an axis. In this manner, the heating member 30 is disposed relatively further away from the supporting surface 11 to avoid overheating of the film to be applied 300, while a good magnetic force of the magnetic attraction member is ensured.

Alternatively, the film carrier 100 further includes: a control unit (not shown) and a temperature control element (not shown). The heating member 30 and the temperature control element are both electrically connected to the control unit. The temperature control element is adapted to detect a temperature of the supporting surface 11 and send a temperature signal to the control unit. The control unit is adapted to turn off the heating member when a temperature value detected by the temperature control element is higher than a first temperature value (a preset value), and turn on the heating member when the temperature value detected by the temperature control element is lower than the first temperature value (a preset value).

It should be understood that the first temperature value may be a numerical range. When the temperature detected by the temperature control element is higher than an upper limit of the numerical range (maximum temperature threshold), the control unit disconnects a circuit of the heating element after receiving a temperature signal so that the heating element stops heating to avoid damage to the film to be applied 300 due to excessive temperature. When the temperature detected by the temperature control element is lower than a lower limit of the numerical range (minimum temperature threshold), the control unit connects the circuit of the heating element after receiving a temperature signal so that the heating element starts heating. Specifically, the temperature control element may be a thermocouple. Thereby, a surface temperature of the supporting surface 11 may be adjusted, and a temperature of the film to be applied 300 may be reasonably controlled.

In the film carrier 100 according to an embodiment of the disclosure, a curvature of the projection of the supporting surface 11 in the plane perpendicular to the axial direction may be constant, and an axis of the projection of the supporting surface 11 at a curvature centre of the projection is parallel to or collinear with an axis of rotation of the main body part 10. Unless otherwise specified, the projection of the supporting surface 11 herein means a projection of the supporting surface 11 in the plane perpendicular to the axial direction of the main body part. Specifically, the supporting surface 11 may be formed as a part of an outer sidewall of a cylinder, and a straight line passes through the curvature centers of a plurality of projections of the supporting surface 11 is a central axis of a virtual cylinder where the supporting surface 11 belongs. The central axis is parallel to or collinear with the axis of rotation of the main body part 10. In this manner, the swing of the supporting surface 11 is made smoother and more reliable.

In the film carrier 100 according to an embodiment of the disclosure, the supporting surface 11 is formed to be an elastic friction surface. Specifically, the supporting surface 11 is still a flat surface. On this basis, the supporting surface 11 may be made of a material having a large friction coefficient to enhance stability of the metal film 301 temporarily fixed on the film carrier 100, and prevent the metal film 301 from sliding off.

It should be understood that the supporting surface 11 refers to a surface of the main body part 10 for supporting and carrying the film to be applied 300. The main body part 10 is a structure capable of forming the curved supporting surface 11. For example, the main body part 10 may have an elliptical cylindrical shape or a cylindrical shape. The main body part 10 may also be a part of an elliptical cylinder, a part of a cylinder or an arched plate, in which case the supporting surface 11 is a sidewall of the elliptical cylinder or cylinder. The supporting surface 11 may be formed directly by processing a surface of a semi-finished main body part 10 by a process, or may be formed by spraying or coating a coating or plating layer having a larger friction coefficient on the surface of the semi-finished main body part 10.

In the specific embodiment shown in MG. 1, an outer contour of a cross section of the main body part 10 has a fan shape, and the main body part 10 may be a hollow structure, thereby realizing lightweight of the main body part 10 and reducing material cost, while enhancing an overall strength of the main body part 10.

Figure 7:
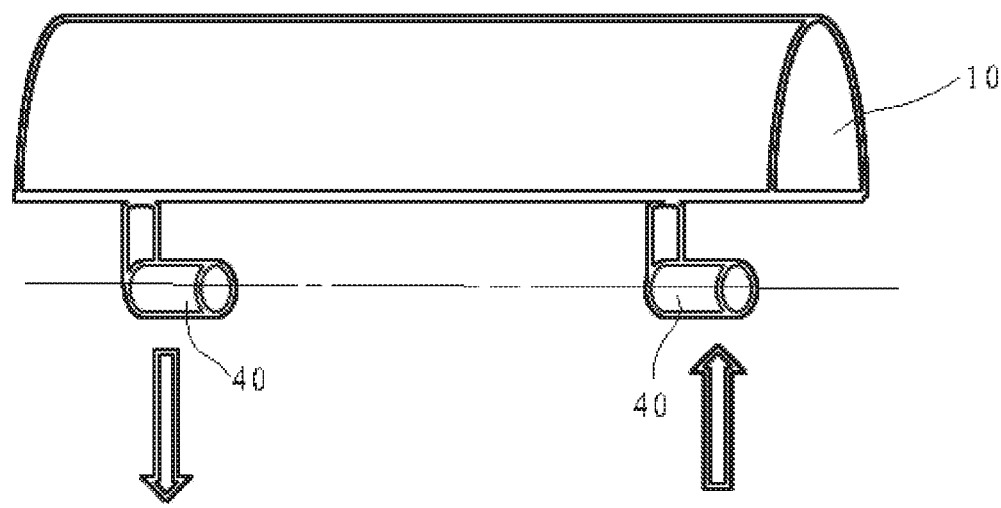
FIG. 7 is a schematic view showing an adjustment motor adjusting a levelness of the film carrier according to an embodiment of the disclosure.

As shown in FIG. 8, the main body part 10 is configured to be rotatable and stay at a first flip angle, and as shown in FIG. 7, the main body part 10 is movable in a direction perpendicular to the axial direction. Thus, when it is required to peel off the film and realize positioning of the film to be applied 300 during the film application, the main body part 10 may be driven to move so that the main body part 10 is adjusted to a proper position. In addition, when the inclination angle of the film to be applied 300 is required to be adjusted, the main body part 10 may be driven to rotate by an appropriate angle, so as to further enhance flatness of the film while improving the film yield.

In that, the rotation of the main body part 10 may be driven by a rotating motor or motor, and the movement of the main body part 10 may be driven by a linear motor (not shown) or by a combination of the rotating motor and a rack-pinion transmission mechanism (or a screw-nut transmission mechanism).

Alternatively, the film carrier 100 may further include an adjustment motor 40, a pressure sensing element (not shown), and a control unit electrically connected to the two, respectively. The pressure sensing element is configured to detect a pressure on the supporting surface 11 and send a pressure signal to the control unit. The control unit is configured to, when the supporting surface 11 is under an inconsistent pressure in the axial direction, control the adjustment motor 40 to adjust a levelness of the main body part 10 until the supporting surface is under a consistent pressure in the axial direction.

Specifically, the pressure sensing element may be a pressure sensor or a strain gauge that is disposed along the axial direction of the main body part. The main body part 10 includes a body of the main body part 10 and a supporting surface 11. The pressure sensing element may be embedded between the body of the main body part 10 and the supporting surface 11. In this manner, a parallelism of the main body part 10 (i.e., a parallelism of the central axis of the supporting surface 11) may be adjusted according to the detection result of the pressure sensing element obtained by preliminary contact of the supporting surface 11 with the display panel before the film is applied.

Thereby, the pressure applied to the supporting surface 11 by the substrate 600 during the film application is detected by the pressure sensing element so that when the supporting surface 11 suffers an uneven force, the control unit controls the adjustment motor 40 to drive a side of the main body part 10 suffering a smaller force toward the substrate 600, or a side suffering a greater force away from the substrate 600. Thus, the levelness of the main body part 10 is adjusted by the adjustment motor 40, and the force applied during the ti m application is more uniform.

It should be understood that the control unit may be disposed on the film carrier 100, or may be electrically connected to the sensing element, but not integrated on the film carrier 100. The motor for driving rotation or movement and the adjustment motor 40 (see FIG. 7) for adjusting the levelness of the main body part 10 may be fixed on a bracket (not shown) independent of the main body part 10. Thus, the main body part 10 may be driven to move, rotate or tilt correspondingly under the action of the respective drive motors.

As shown in FIGS. 2 to 6, a film application apparatus according to an embodiment of the second aspect of the present disclosure includes: a peeling device 200 and the film carrier 100 according to the above embodiments. The peeling device 200 has two peeling members 201 that are arranged in parallel and movable in opposite directions. The film carrier 100 is adapted to carry a film to be applied 300. The film to be applied 300 includes a metal film 301, an adhesive film 302 and a release film 303 stacked in sequence. The release film 303 has a dividing line 304 predividing the release film 303 into two parts, and the two peeling members 201 are configured to be capable of peeling off the two parts of the release film 303 at two sides of the dividing line 304, respectively.

Figure 3:
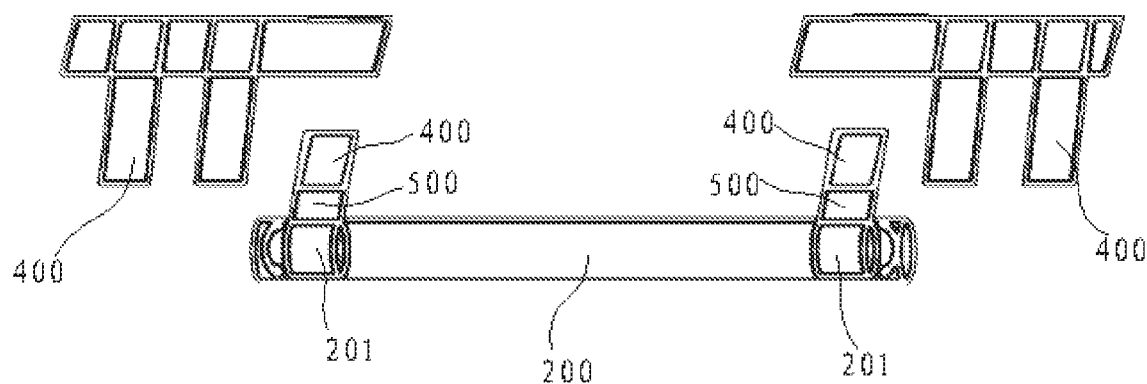
FIG. 3 is a schematic view showing the peeling member of the peeling device after taking the label according to an embodiment of the disclosure.
Figure 4:
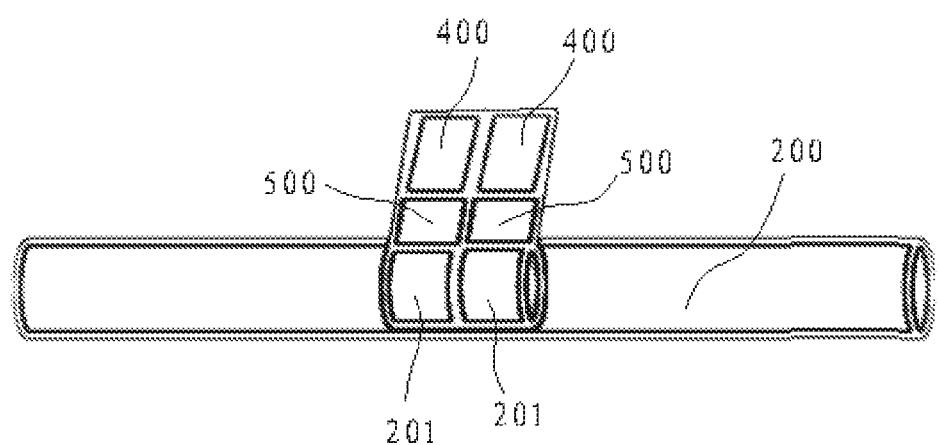
FIG. 4 is a schematic view showing a position of the label on the peeling device according to an embodiment of the disclosure.

In that, referring to FIG. 3, the peeling member 201 grabs a label 400 with a tape, and bonds the label 400 to the release film 303 of the film to be applied 300 (see FIGS. 4 and 5) so that the peeling member 201 may move to pull the label 400 and thus peel off the release film 303 (see FIG. 6).

Thereby, by gradually moving the two peeling members 201 of the peeling device 200 away from each other (moving in opposite directions), the film application apparatus peels off the two parts of the release film 303 predivided by the dividing line during the movement of the two peeling member 201 away from each other. Thus, a force is applied from the middle of the release film 303 to peel off the two parts of the release film 303 along the dividing line respectively, thereby avoiding damage to the adhesive film 302 and the metal film 301 due to peeling off the release film from a corner of the film to be applied.

A use process of the film application apparatus according to the embodiment of the second aspect of the disclosure will be briefly described below.

First, the film to be applied 300 is placed on the supporting surface 11 of the film carrier 100 by a transfer platform and a locating pin, and the film to be applied 300 is attracted and fixed by a magnetic attraction member and/or a vacuum attraction member. Then, in order to prevent warpage of individual regions of the metal film 301, a rubber anti-static roller 500 is used to perform a preliminary roll-pressing to the metal film 301, so as to eliminate warpage. After that, an initial alignment is performed to prepare for peeling off the film next.

Next, the film peeling operation is started. The peeling member 201 (which may be a rotating shaft or a manipulator) of the peeling device 200 grabs the label 400 and then adheres it to both sides of the dividing line 304 of the release film 303. The film is peeled off from the middle of the release film 303 obliquely to the two sides of the film to be applied, so as to prevent the adhesive film 302 from being carried away from the metal film 301, as shown in FIGS. 2 to 6.

Finally, after the film peeling is completed, the film carrier 100 is moved below a platform for attracting the substrate 600 for performing a second alignment. By calculation of a distance (i.e., a focal length) between the main body part 10 and the platform for attracting the substrate 600, and self-adjustment of the parallelism of the main body part 10 (i.e., the central axis surrounded by the supporting surface 11 during swinging), aligning the substrate 600 of the display panel with the metal film 301 is achieved, and the alignment accuracy is improved. Then, the metal film 301 is attached to the substrate 600 by roll-pressing from a top side of the supporting surface 11 located at an edge of the substrate 600 at a low speed. The magnetic attraction member and the vacuum suction member are closed one by one with movement of the film carrier 100, thus ensuring that the metal film 301 and the adhesive film 302 as a whole can be attached to the substrate 600 (such as a glass back panel). Thus, a film peeling and attachment cycle is completed. If small defects are found, the roll-pressing may be manually performed again for correction, as shown in FIGS. 7 and 8.

An embodiment according to a third aspect of the disclosure seeks to protect a film to be applied 300 used in a display panel. As shown in FIGS. 1, 5, and 6, the film to be applied 300 includes a metal film 301, an adhesive film 302 and a release film 303 stacked in sequence. The release film 303 has a dividing line 304 predividing the release film 303 into two parts.

It should be noted that "predivide" does not mean that the release film 303 has been completely cut before being peeled off, but that the release film 303 is still a whole part at then, and "predivide" is intended to demarcate a dividing boundary of the release film 303 in advance.

For the release film 303, the dividing line 304 may be formed by removing a part of the release film 303 on a certain line. Thus, a region that hardly bears great force is formed at the dividing line 304 so that the release film 303 may be firstly broken at the dividing line 304 under a force to enable the release film 303 to be split in a preset trajectory. The release film 303 may be a plastic film so that a release film 303 with a dividing line may be directly formed by adding a heat cutting process during the machining process.

As shown in FIGS. 1 to 8, a film application method according to an embodiment of a fourth aspect of the present disclosure includes:

S1: placing a film to be applied on a curved supporting surface of a film carrier, wherein the film to be applied includes a metal film, an adhesive film and a release film stacked in sequence, the release film having a dividing line predividing the release film into two parts.

S2: controlling an attraction member to attract the film to be applied. Specifically, the attraction member includes a vacuum attraction member and/or a magnetic attraction member. The magnetic attraction member may include a plurality of electromagnets, and the vacuum attraction member may include a plurality of suction holes distributed on the main body part in communication with the supporting surface. One end of the plurality of suction holes may pass through the supporting surface, while the other end of the plurality of suction holes is configured to be connected to a vacuumizing device. The plurality of electromagnets and the plurality of suction holes are both distributed along the bending direction of the supporting surface in sequence. In this manner, by controlling energization of the electromagnets and controlling the vacuumizing device, the attraction of the magnetic attraction member to the film to be applied may be achieved.

S3: sticking labels to adjacent corners of two parts of a release film of the film to be applied at two sides of a dividing line. In other words, the peeling member of the peeling device grabs the labels and bonds them to the opposite corners (sides) of the two predivided parts of the release film at a position adjacent to the dividing line.

S4: pulling each of the labels in a direction away from the dividing line to pull the release film, so as to peel off the two parts of the release film, respectively. Alternatively, each of the labels is attached to a corner of the two predivided parts of the release film and moved away from each other in a diagonal direction, so as to achieve separation and peeling of the release film.

S5: controlling a heating member of the film carrier to heat the supporting surface for a first time value (a preset value). The heating member is disposed on the main body part for heating the supporting surface.

S6: moving the film carrier to just below a substrate of a display panel and making the substrate correspond to the metal film of the film to be applied.

S7: adjusting levelness and a flip angle of the main body part. In this manner, the levelness of the supporting surface may be adjusted to balance and stabilize a force exerted on the substrate by the metal film, and the inclination angle of the supporting surface relative to the substrate may be adjusted to meet film application requirements of the substrates with different sizes and shapes.

S8: bonding an end of the adhesive film of the film to be applied close to the substrate to the substrate, roll-pressing the metal film and then controlling the attraction member to stop attraction synchronically with the metal film separating from the supporting surface; in this way, continuously rotating the main body part of the film carrier, until the other end of the adhesive film disposed initially far away from the substrate is attached to the substrate and then leaves the substrate.

S9: finishing film application.

Thus, the above-mentioned film peeling method and film application method improves the yield and efficiency of film peeling and application, and may overcome the following defects in current film application apparatus and film application methods:

1) when peeling off the release film, the existing film application apparatus peels off the release film from a corner of the release film to peel off the release film, which may cause a failure of film peeling as well as a low efficiency in film peeling and film application;

2) during the process of the film application, the metal film straightened on the film carrier tends to fail to be aligned with the display panel, and the applied film has a poor uniformity, which tends to cause a non-flat film, bulging in the metal film and other problems, thus making the whole display panel scrapped;

3) during the process of the film application, the substrate of the display panel is usually heated to soften the adhesive film, thereby enhancing adhesion of the adhesive film. However, the substrate of the display panel usually contains a glass material, which, under heating, will cause the substrate of the display panel to be thermally bent. Thus the quality of the display panel is seriously affected.

It should be noted that the film application method may be implemented by the film application apparatus of the abovementioned embodiments, and the film application method using the abovementioned film application apparatus has all the advantages of the film application apparatus, which will not be repeated here.

It should be understood that in the description of the present disclosure, orientation or positional relationships referred by terms like "center", "longitudinal", "lateral", "length", "width", "thickness", "upper", "lower", "front", "back", "left", "right", "vertical", "horizontal", "top", "bottom", "inside", "outside", "clockwise", "counter clockwise", "axial", "radial", "circumferential" and the like are based on the orientation or positional relationship shown in the drawings, and are merely for an illustrative and simplified description of the disclosure instead of indicting or implying that the structure or unit referred to must have a specific orientation, must be configured or operated at a specific orientation, and thus cannot be interpreted as limitations to the present disclosure. In addition, features defined by "first" or "second" may include one or more of the features either explicitly or implicitly. In the description of the present disclosure, "a plurality" means two or more unless otherwise specified.

In the description of the present disclosure, a description with reference to the terms "one embodiment", "some embodiments", "exemplary embodiment", "example", "specific example", or "some examples", etc. means that the specific features, structures, materials, or characteristics described in the embodiment or example are included in at least one embodiment or example of the present disclosure. In this description, the schematic representation of the above terms does not necessarily mean the same embodiment or example. Further, the described specific features, structures, materials or characteristics may be combined in any suitable manner in any one or more embodiments or examples.

While the embodiments of the present disclosure have been shown and described, it will be understood by those ordinary skilled in the art that various changes, modifications, alternations and variations of these embodiments may be made without departing from the principles and spirit of the disclosure. The scope of the disclosure is defined by the claims and equivalents thereof.

What is claimed is:

1. A film carrier, comprising:
   a main body part with a supporting surface which is rotatable to drive the supporting surface to swing around an axial direction of the main body part, and the supporting surface having a curved projection in a plane perpendicular to the axial direction; and
   an attraction member, which is disposed on the main body part and configured to attract a film to be applied on the supporting surface,
   wherein the attraction member is at least one of a vacuum attraction member and a magnetic attraction member, wherein the attraction member includes the vacuum attraction member and the magnetic attraction member, each of which is configured to be distributed layer by layer along a bending direction of the supporting surface, and each layer of the vacuum attraction member and each layer of the magnetic attraction member are capable of independently attracting the film to be applied.

2. The film carrier according to claim 1, wherein the supporting surface has an arched projection in the plane perpendicular to the axial direction.

3. The film carrier according to claim 1, wherein the magnetic attraction member includes a plurality of electromagnets, the vacuum attraction member includes a plurality of suction holes distributed on the main body part in communication with the supporting surface, and the plurality of electromagnets and the plurality of suction holes are both distributed along the bending direction of the supporting surface in sequence.

4. The film carrier according to claim 3, wherein the plurality of electromagnets are disposed to be spaced from each other at a back of the supporting surface.

5. The film carrier according to claim 3, wherein one end of the plurality of suction holes passes through the supporting surface, while the other end of the plurality of suction holes is configured to be connected to a vacuumizing device.

6. The film carrier according to claim 1, further comprising: a heating member disposed on the main body part for heating the supporting surface.

7. The film carrier according to claim 5, wherein the attraction member includes at least a magnetic attraction member, and the heating member is disposed to be further away from the supporting surface in a radial direction of the main body part than the magnetic attraction member.

8. The film carrier according to claim 5, further comprising: a control unit and a temperature control element, wherein the heating member and the temperature control element are both electrically connected to the control unit, the temperature control element is adapted to detect a temperature of the supporting surface and send a temperature signal to the control unit, and the control unit is adapted to turn off the heating member when a temperature value detected by the temperature control element is higher than a first temperature value, and turn on the heating member when the temperature value detected by the temperature control element is lower than the first temperature value.

9. The film carrier according to claim 1, wherein a curvature of the projection of the supporting surface in the plane perpendicular to the axial direction is constant, and an axis of the projection at a curvature centre of the projection is parallel to or coincident with an axis of rotation of the main body part.

10. The film carrier according to claim 1, wherein the supporting surface is an elastic friction surface.

11. The film carrier according to claim 1, wherein the main body part is configured to be rotatable and stay at a first flip angle, and be movable in a direction perpendicular to the axial direction.

12. The film carrier according to claim 1, further comprising: an adjustment motor, a pressure sensing element, and a control unit electrically connected to the adjustment motor and the pressure sensing element, respectively, the pressure sensing element being configured to detect a pressure on the supporting surface and send a pressure signal to the control unit, the control unit being configured to, when the supporting surface is under an inconsistent pressure in the axial direction, control the adjustment motor to adjust a levelness of the main body part until the supporting surface is under a consistent pressure in the axial direction.

13. A film application apparatus, comprising:
a peeling device having two peeling members that are arranged in parallel and movable in opposite directions; and
the film carrier according to claim 1, which is adapted to carry a film to be applied,
wherein the film to be applied includes a metal film, an adhesive film and a release film stacked in sequence, the release film has a dividing line predividing the release film into two parts, and the two peeling members are configured to be capable of peeling off the two parts of the release film at two sides of the dividing line, respectively.

14. A film to be applied, which is used in the film carrier according to claim 1, wherein the film to be applied includes a metal film, an adhesive film and a release film stacked in sequence, the release film having a dividing line predividing the release film into two parts.

15. A film application method, comprising:
placing a film to be applied on the curved supporting surface of the film carrier according to claim 1;
controlling an attraction member to attract the film to be applied;
sticking labels to adjacent corners of two parts of a release film of the film to be applied at two sides of a dividing line;
pulling each of the labels in a direction away from the dividing line to pull the release film, so as to peel off the two parts of the release film, respectively;
controlling a heating member of the film carrier to heat the supporting surface for a first time value;
moving the film carrier to just below a substrate of a display panel and making the substrate correspond to a metal film of the film to be applied;
adjusting a levelness and a flip angle of a main body part;
bonding an end of an adhesive film of the film to be applied close to the substrate to the substrate, roll-pressing the metal film and then controlling the attraction member to stop attraction synchronically with the metal film separating from the supporting surface.

* * * * *